United States Patent

Ushio et al.

[11] Patent Number: 5,288,950
[45] Date of Patent: Feb. 22, 1994

[54] FLEXIBLE WIRING BOARD AND METHOD OF PREPARING THE SAME

[75] Inventors: Ryozo Ushio, Ichikawa; Akio Takatsu; Yoshinori Suzuki, both of Tokyo, all of Japan

[73] Assignee: Sumitomo Metal Mining Company Limited, Tokyo, Japan

[21] Appl. No.: 835,580

[22] Filed: Feb. 14, 1992

[30] Foreign Application Priority Data

Feb. 15, 1991 [JP] Japan .................................. 3-042431
Mar. 5, 1991 [JP] Japan .................................. 3-063891
Jan. 22, 1992 [JP] Japan .................................. 4-029878

[51] Int. Cl.$^5$ ............................................. H05K 1/00
[52] U.S. Cl. ................................... 174/254; 174/268; 174/52.4; 257/666; 361/749
[58] Field of Search .................... 174/254, 268, 52.4; 361/421, 398; 257/666, 669, 671, 672

[56] References Cited

U.S. PATENT DOCUMENTS

| | | | |
|---|---|---|---|
| 3,195,079 | 7/1965 | Burton et al. | 174/254 |
| 3,255,299 | 3/1964 | Hartsock | 174/254 |
| 4,246,596 | 1/1981 | Iwasaki | 257/666 X |
| 5,144,534 | 9/1992 | Kober | 361/398 |

Primary Examiner—Leo P. Picard
Assistant Examiner—L. Thomas
Attorney, Agent, or Firm—Watson, Cole, Grindle & Watson

[57] ABSTRACT

Disclosed are a flexible wiring board in which the thickness of at least one part of the insulating film support to be bent in actual use of the board is made thinner than that of the other parts of it and the surfaces of the conductive patterns containing the part to be bent are covered each with a silicone rubber coveray, and a method of preparing the board. The board has sufficient flexibility enough to be well bent at the determined part in actual use thereof with ensuring the reliability of connection at the bent part.

5 Claims, 3 Drawing Sheets

PRIOR ART

FLEXIBLE WIRING BOARD AND METHOD OF PREPARING THE SAME

FIELD OF THE INVENTION

The present invention relates to a flexible wiring board which is used for loading IC chips onto a substrate or for connecting circuit boards loaded with IC chips or other electronic parts thereon, in particular, one which is bent in actual use thereof for fitting, as well as to a method of preparing the same.

BACKGROUND OF THE INVENTION

As a means of connecting an electrode terminal of a tabular display device having liquid crystals or electroluminescent elements and a driving electronic circuit board (hereinafter referred to as an "external board"), in general, a flexible wiring board is used. For the purpose of making devices small-sized and lightweight, a method of loading driving IC chips onto a flexible tape carrier by means of TAB (tape automated bonding) technique and connecting the tape carrier, which is used as a flexible wiring board, and an external board is widely used. In any case, such a flexible wiring board (or tape carrier) is frequently bent in actual use thereof for connecting it with an external board as arranged on the back of a display device for the purpose of attaining close contact between the connected parts with each other.

The flexibility of a conventional flexible wiring board is insufficient for using it as a bent form. Therefore, in such a conventional flexible wiring board as shown in FIG. 5, the insulator film (1) in the part to be bent is removed to form a through-hole (8b) so as to ensure the flexibility of the part before the board is bent. However, in a flexible wiring board having a through-hole through the insulator film in the part to be bent, since the conductive pattern (3) is exposed in the bent part (8), the exposed part is susceptable to short-circuiting or wire-cutting. Where a complete through-hole is formed along the whole of the part of the board to be bent, the tensile strength of the board would lower at the part having the through-hole, so that there occurs another problem that the board itself would be broken during handling.

In a conventional flexible wiring board, in general, a conductive pattern formed on an insulator film is covered with a cover layer (6) of an epoxy resist for the purpose of preventing lowering of the function of the conductor due to adhesion of dust or water to the surface of the pattern. However, the cover layer is often cracked when the board is bent so that dust or water can penetrate into the pattern through the cracks to also cause short-circuiting or breaking and corrosion of the conductor.

SUMMARY OF THE INVENTION

The object of the present invention is to provide a flexible wiring board which is free from the above-mentioned problems of the conventional flexible wiring board, which has sufficient flexibility to be well bent in actual use thereof, ensuring the reliability of connection in the bent part, and which is not cracked by bending, and to also provide a method of preparing the board.

In order to attain the object, there is provided in accordance with the present invention a flexible wiring board in which the thickness of the insulating film is made thinner in at least one part to be bent in actual use of the board than in the other parts and the surface of the conductive pattern of containing the part to be bent is covered with a silicone rubber cover layer, and also a method of preparing the board.

In these drawings, 1 is an insulating film, 2 is a sprocket hole, 3 is a conductive pattern, 4 is a device hole, 5 is an OLB hole, 6 is a cover layer, 7 is an conductor terminal, 8 is a part to be bent in actual use of the board, and 8a is a non-through hole for bending (thinned part of insulating film).

DETAILED DESCRIPTION OF THE INVENTION

The present invention will be explained in detail hereunder along with the effect thereof.

Figure 1:
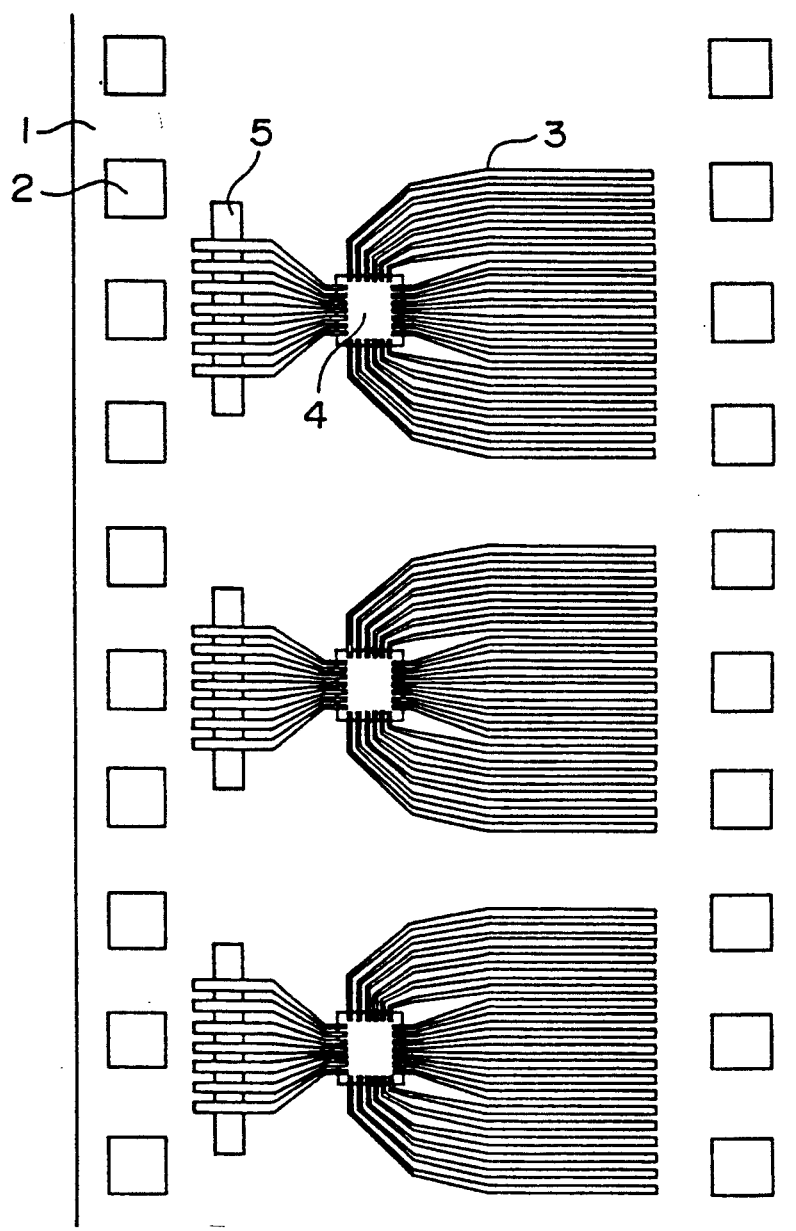
FIG. 1 is a plan view of showing one embodiment of a flexible wiring board (tape carrier) of the present invention where the wiring pattern is not covered with a cover layer.
Figure 2:
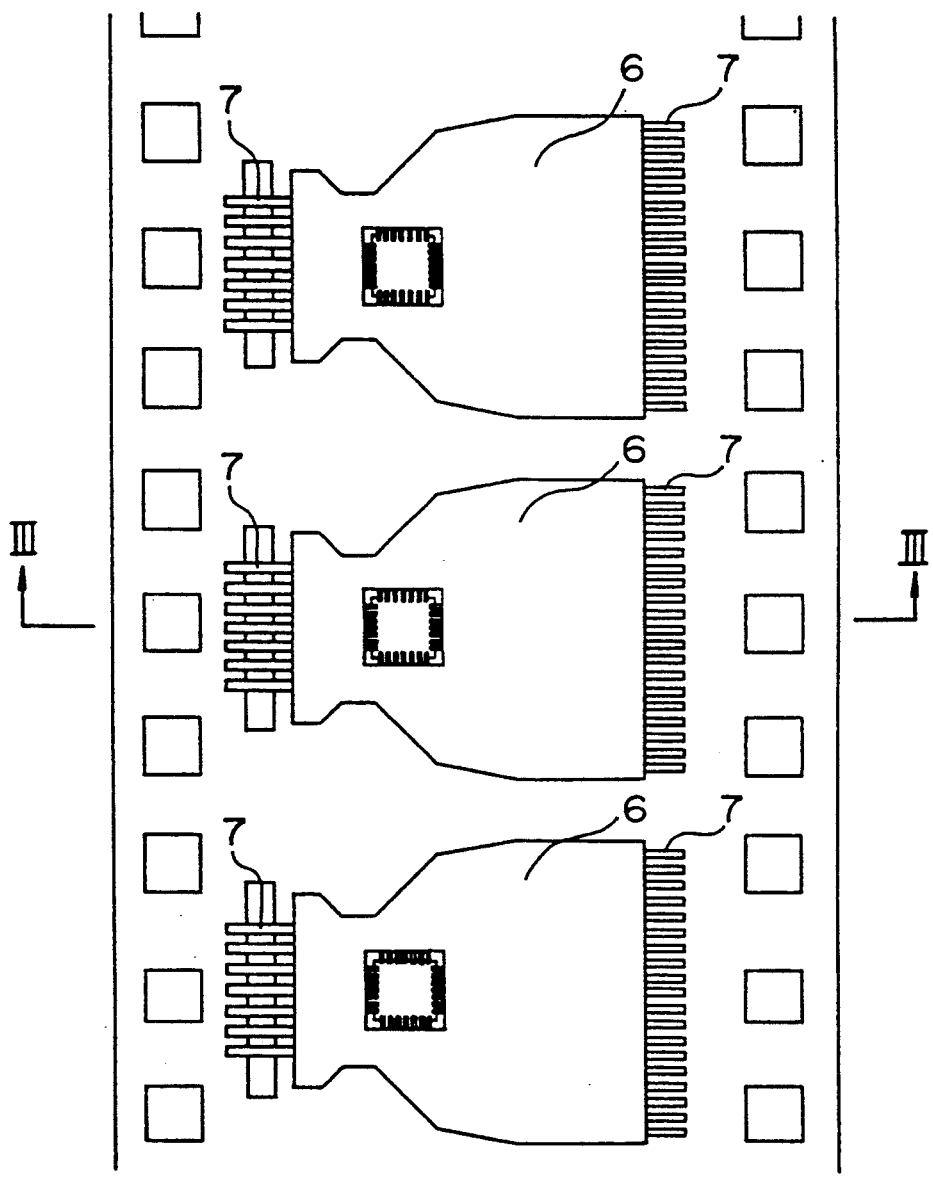
FIG. 2 is a plan view corresponding to FIG. 1, in which the wiring pattern has been covered with a cover layer.
Figure 3:
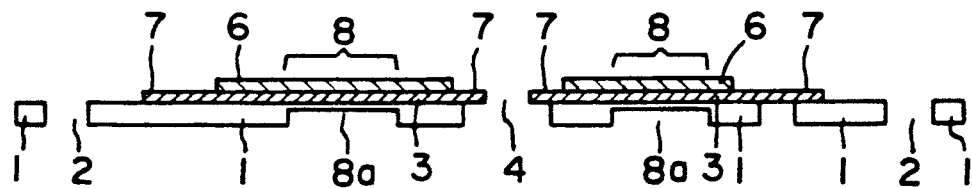
FIG. 3 is a cross-sectional view of showing the structure of III—III cross section of FIG. 2.
Figure 4:
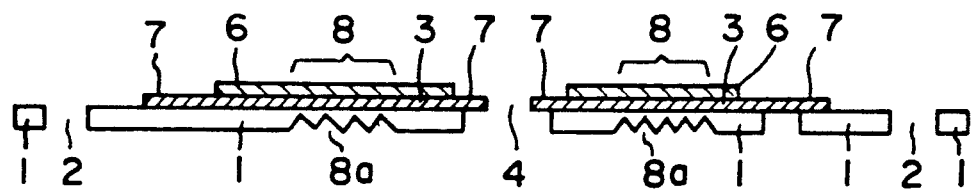
FIG. 4 is a cross-sectional view of showing the structure according another embodiment.
Figure 5:
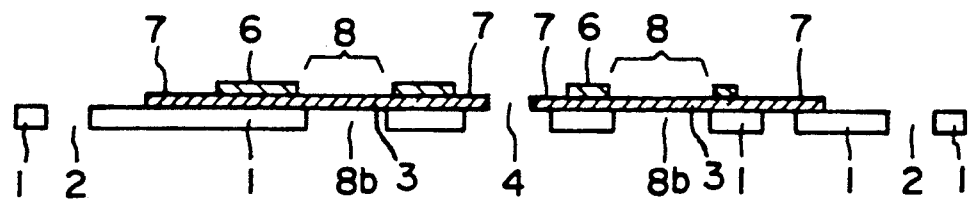
FIG. 5 is a cross-sectional view corresponding to FIG. 3, which shows a cross section structure of a conventional flexible wiring board.

The drawings attached hereto illustrate an embodiment of the present invention. FIG. 1 is a plan view of a flexible wiring board not covered with a silicone rubber cover layer, in which (1) is an insulating film; (2) is a sprocket hole for conveying the board, as formed through the insulating film; (3) is a copper conductive pattern as provided on the insulating film (1); and (4) and (5) are a device hole and an OLB hole, respectively, as formed through the insulating film (1) so as to expose the wiring terminals to be connected with IC chips and external circuits. FIG. 2 is a plan view of showing a flexible wiring board of the present invention, in which the conductive pattern (3) of FIG. 1 is covered with a silicone rubber cover layer and the parts of the insulating film (1) to be bent in actual use of the board is made thinner than the other parts thereof. As is shown in FIG. 2, the cover layer (6) is provided over the conductive pattern (3) in such a way that the terminal (7) of each conductor of the pattern (3) is exposed. FIGS. 3 and 4 are cross-sectional views along line III—III of FIG. 2. As is shown in FIGS. 3 and 4, the part (8) of the insulating film (1) to be bent is made thinner to have provide at least one area (8a) thinner than any other part i.e., in the form of a recessed portion as shown in FIG. 3 or a saw-toothed portion as shown in FIG. 4.

Since the flexible wiring board of the present invention has bent, the part is fully flexible and may well be bent in actual use of the board. In addition, since the board does not have a through-hole in the part to be bent, the conductor of the part is not exposed and therefore the board has no danger of wire-cutting or short-circuiting.

As a means of forming a flexible wiring board of the present invention, a method may be employed in which resist pattern holes are formed in the part of the insulating film to be bent by general photolithography technique, and the insulating film of the parts is chemically dissolved with the dissolution being stopped before formation of through-holes whereupon the parts of the insulating film may be made thinner than the other parts thereof. Where a flexible wiring board necessarily having through-holes such as device holes through the insulating film is formed in accordance with the method, the opening parts of the resist pattern for the non-through holes to be formed in the part to be bent may be made smaller than those of the resist pattern for the through-holes whereby all the through-holes and the non-through holes may be formed simultaneously. Thus, the method is advantageous in that it does not need any additional step for forming the non-through holes.

Apart from the above-mentioned chemical dissolution method, production of a flexible wiring board having the structure as proposed by the present invention is also possible, for example, by a method of irradiating a laser ray to the part to be bent to such a degree that the part does not develop through-holes due to the irradiation so that the insulating film of the part is partly vaporized and removed, or by a method of mechanically removing the insulating film in the part to be bent. Where the flexible wiring board of the present invention is produced by these methods, the board may of course attain the same effect. The thickness of the thin part to be formed in the part of the insulating film to be bent in accordance with the present invention is not specifically defined, as varying in accordance with the material of the insulating film as well as the initial thickness thereof. Necessarily, it may be within the range of yielding good bending of the board without so much impairing the tensile strength of the board.

In accordance with the present invention, a silicone rubber is used as a cover layer over the conductive pattern of containing the part to be bent, in place of a conventional epoxy resist film. Therefore, the cover layer is not cracked when the board is bent in actual use thereof. This is because silicone rubber is excellent in heat resistance, chemical resistance, electric insulating property, weather resistance and durability, and it also has excellent characteristics with respect to the modulus of elasticity and bending strength.

In addition, since shrinkage of since silicone rubber due to vaporization of the volatile components therefrom during curing after coating is extremely small, the silicone rubber cover layer is free from warping of the board after curing.

As a means of providing silicone rubber over the conductive pattern on the part of the insulating film to be bent, for example, a method is employable in which a liquid silicone rubber is printed in a desired thickness in the determined parts on the board having a conductive pattern thereon by the use of a continuous screen printing machine as equipped with a precision screen such as a stainless screen and thereafter is maintained at a room temperature or is heated so that the printed rubber is cured.

As silicone rubber to be coated over the surface of the conductor, any of those curable by condensation reaction or those curable by addition reaction under heat may be used. However, the latter would be preferred to the former, in view of the facts that curing of the former rubbers would go on easily so that the viscosity of them would increase during printing and the viscous rubbers would adhere onto the screen to lower the printing accuracy and that removal of the rubbers as adhered to and cured on the screen after printing is difficult, while the latter rubbers have a high curing temperature of from 100° to 150° C. so that the viscosity of the them does not increase and the rubber liquid does not adhere to the screen. Because of the reasons, employment of the latter silicone rubbers curable by addition reaction under heat is recommended in view of the operation efficiency and the printing accuracy.

Except the above-mentioned matters, the structure of the flexible wiring board as well as the method of preparing the board is not specifically limited but any and every related techniques as ordinarily employed in this technical field for preparing conventional flexible wiring board may apply to the present invention. The details of them are omitted herein.

In the flexible wiring board of the present invention, as mentioned above, the thickness of the insulating film in the part to be bent is made thinner than the other parts of the same. Therefore, the board has sufficient flexibility enough to be well bent in actual use thereof. In addition, since the conductive pattern is not exposed, as having no through-holes in the part to be bent, and additionally the part of conductive pattern to be bent are covered with a well flexible silicone rubber cover layer, the protected and covered parts are not cracked when the board is bent in actual use thereof. Because of the particular structure of the board, the board is free from dangers of short-circuiting or wire-cutting caused by exposure of the conductor. Due to the synergistic effect, the flexible wiring board of the present invention may be used for connecting small-sized and large-scale integrated parts with high connection reliability. In accordance with the method of the present invention, the flexible wiring board having such various advantages can be produced easily and efficiently. Therefore, the method of the present invention is extremely industrially effective.

Next, the present invention will be explained in more detail by way of the following examples, which, however, are not intended to restrict the scope of the present invention.

EXAMPLE 1

A determined copper wiring pattern was formed on one surface of a tape substrate of polyimide resin film (Kapton H, produced by Toray-DuPont C.; 50 μm thickness) (hereinafter referred to as "insulating tape") by an ordinary method to prepare a flexible wiring board. A photo-resist was coated on the opposite surface of the board with the polyimide resin being not covered, and it was exposed to light and developed with a developer to form a resist pattern for forming a non-through hole on the surface, the resist pattern having a resist opening having a width of 50 μm and a length of 20 mm on the part to be bent. Next, the board was dipped in an aqueous solution of ethylenediamine and water (1/1) for 5 minutes so that the polyimide was dissolved. As a result, a non-through hole having a depth of 35 μm was formed in the part to be bent, the thickness of the polyimide resin layer on the part being 15 μm.

Next, a one-solution type condensation-curing silicone rubber (before curing, this is semi-fluid and contains about 5% of volatile components) was printed on the determined area of the wiring pattern of the board by the use of a continuous screen printing machine as equipped with a stainless steel screen printing plate. After printed, the board was rolled up around a roll via an embossed spacer tape and was maintained as it was for 2 hours at room temperature, whereupon the printed silicone rubber was cured to form a silicone rubber cover layer having a thickness of 20 μm over the wiring pattern.

The thus obtained flexible wiring board was put on a flat stand with the cover layer-coated surface facing downwards, whereupon the board was flat and was not warped. Next, the board was subjected to a bending test of bending it to the surface having the wiring pattern with 90 degrees around the part to be bent and having the thinner polyimide resin area as the bending axis, whereupon the board could easily and correctly be bent along the bending axis. The bending test was repeated 10 times, and surface condition of the cover layer over the wiring pattern of the tested board was observed to have no cracks.

EXAMPLE 2

A flexible wiring board as prepared in the same manner as in Example 1 was used. A photo resist was coated on the back surface of the board with the polyimide resin being not covered, and the board was then exposed and developed to form a resist pattern on the surface, which pattern had resist openings for forming sprocket through-holes, device through-holes and OLB through-holes in the determined parts, the openings having a size of 4 mm$^2$, 40 mm$^2$ and 2 mm (width)×15 mm (length), respectively, and additionally had a resist opening for forming a non-through hole on the part to be bent, the opening having a width of 50 μm and a length of 20 mm. Next, the board was dipped in an aqueous solution of ethylenediamine and water (1.1) for 5 minutes so as to dissolve the polyimide, whereby sprocket through-holes and device through-holes were formed in the determined parts and also a non-through hole having a depth of 35 μm was formed in the part to be bent, the thickness of the polyimide resin layer on the part of the through-hole being 15 μm.

Next, a two-solution type addition-reaction curing silicone rubber was printed on the determined area of the wiring pattern of the board by the use of a continuous screen printing machine as equipped with a stainless steel screen printing plate. After printed, the board was immediately passed through a drying furnace having a temperature of from 50° to 100° C. for pre-drying and then it was rolled up around a roll via an embossed spacer tape and was maintained in a heating furnace having a temperature of 120° C. for one hour, whereupon the printed silicone rubber was cured to form a silicone rubber cover layer having a thickness of 20 μm over the wiring pattern. In the present example, since an addition-reaction curing silicone rubber to be cured under heat was used as a silicone rubber for forming the cover layer, the viscosity of the rubber liquid did not change throughout the printing operation so that the rubber liquid did not adhere to the screen at all during printing. As a result, stable formation of the cover layer with high printing accuracy was possible.

The thus obtained flexible wiring board was put on a flat stand with the cover layer-coated surface facing downwards, whereupon the board was flat and was not warped. Next, the board was subjected to a bending test of bending it to the surface having the wiring pattern with 90 degrees around the part to be bent and having the thinner polyimide resin area as the bending axis, whereupon the board could easily and correctly be bent along the bending axis. The bending test was repeated 10 times, and surface condition of the cover layer over the wiring pattern of the tested board was observed to have no cracks.

As explained in detail in the above, since the flexible wiring board of the present invention has such a particular construction that the insulating film of the part to be bent is made thinner than that of the other parts, the board may have sufficient flexibility to be well bent in actual use thereof. In addition, since the cover layer formed over the surface of the wiring pattern is made of a silicone rubber, the cover layer is not cracked when the board is bent. Therefore, the board is free from short-circuiting or wire-cutting due to exposure of the wiring pattern and it may well be used in connecting small-sized and large-scaled electronic parts or integration circuits with high connection reliability. In accordance with the method of the present invention, the flexible wiring board having such industrial advantages may be prepared easily and efficiently.

While the invention has been described in detail and with reference to specific embodiments thereof, it will be apparent to one skilled in the art that various changes and modifications can be made therein without departing from the spirit and scope thereof.

What is claimed is:

1. A flexible wiring board composed of a flexible insulating support film having opposite first and second sides and plural wiring patterns on said first side thereof, said insulating support film having a thickness in one part to be bent in use thereof which is thinner than that in other parts thereof, and a silicone rubber cover layer covering the wiring patterns and said part to be bent.

2. The flexible wiring board as claimed in claim 1, wherein said thinner part is provided by a rectangular recess in the second side of said insulating support film.

3. A flexible wiring board as claimed in claim 1, wherein said thinner part is provided by a saw-toothed recess in the second side of said insulating support film.

4. A flexible wiring board as claimed in claim 1, wherein said flexible insulating support film is formed of polyimide resin.

5. A flexible wiring board as claimed in claim 1, wherein said flexible insulating support film defines lateral sides, wherein said plural wiring patterns define portions which extend toward one of said lateral sides and provide terminal ends, and wherein said silicone rubber cover layer does not cover said terminal ends.

* * * * *